United States Patent [19]

Song et al.

[11] Patent Number: 5,733,793
[45] Date of Patent: Mar. 31, 1998

[54] PROCESS FORMATION OF A THIN FILM TRANSISTOR

[75] Inventors: Yoon-Ho Song; Kyung-Ho Park; Kee-Soo Nam, all of Daejeon, Rep. of Korea

[73] Assignee: Electronics and Telecommunications Research Institute, Daejeon, Rep. of Korea

[21] Appl. No.: 796,141

[22] Filed: Feb. 6, 1997

Related U.S. Application Data

[63] Continuation-in-part of Ser. No. 359,208, Dec. 19, 1994, abandoned.

[51] Int. Cl.⁶ .................................................. H01L 21/786
[52] U.S. Cl. .......................... 437/40 TFT; 437/41 TFT; 437/233; 437/247
[58] Field of Search ............ 437/40 TFT, 41 TFT, 437/233, 238, 913, 21, 84, 247; 148/DIG. 150

[56] References Cited

U.S. PATENT DOCUMENTS

| | | | |
|---|---|---|---|
| 5,060,035 | 10/1991 | Nishimura et al. | 257/57 |
| 5,112,764 | 5/1992 | Mitra et al. | 437/44 |
| 5,248,630 | 9/1993 | Serikawa et al. | 437/101 |
| 5,252,502 | 10/1993 | Haveman | 437/21 |
| 5,254,208 | 10/1993 | Zhang | 117/8 |
| 5,395,804 | 3/1995 | Ueda | 437/937 |
| 5,426,064 | 6/1995 | Zhang et al. | 437/247 |

FOREIGN PATENT DOCUMENTS

| | | | |
|---|---|---|---|
| 0383230 | 8/1990 | European Pat. Off. | 437/84 |
| 58-56467 | 4/1983 | Japan . | |
| 63-304670 | 12/1988 | Japan . | |
| 1-214012 | 8/1989 | Japan | 437/84 |
| 2-184076 | 7/1990 | Japan | 148/DIG. 150 |
| 3-4564 | 1/1991 | Japan . | |
| 6-84944 | 3/1994 | Japan | 437/21 |

OTHER PUBLICATIONS

Ipri et al., "A 600–650° C Polysilicon CMOS Process for Fabricating Fully Scanned Active matrix LCDs", Proceedings of the SID, vol. 29/2; pp. 167–171, 1988.

A.C. Ipri et al., SID Proc. 29(2)(1988)167, "A 600–650C ° polysilicon CMOS . . . ", Feb. 1988.

T. Noguchi et al., Jpn.J.Appl.Phys. 24(6)(1985)L434 "Grain Growth . . . Polysilicon Films by Oxidation" Jun. 1985.

S. Wolf & R.N. Tauber, "Silicon Processing for the VLSI Era", vol. 1, pp. 216–219, 230–235, 1986.

Primary Examiner—Michael Trinh
Attorney, Agent, or Firm—Antonelli, Terry, Stout & Kraus, LLP.

[57] ABSTRACT

A process for formation of a thin film transistor which can be usefully applied to a high picture quality active matrix liquid crystal display is disclosed. Particularly, a process for formation of an improved polysilicon thin film transistor is disclosed. In the process for formation of a polysilicon thin film transistor, the solid phase crystallization of a non-crystalline silicon is carried out under a high pressure oxygen atmosphere, and therefore, the solid phase crystallization time for a non-crystalline silicon is shortened so as to improve the productivity, and the grain size of the polysilicon is made more uniform so as improve the electrical characteristics of the TFT (thin film transistor).

4 Claims, 10 Drawing Sheets

PROCESS FORMATION OF A THIN FILM TRANSISTOR

CROSS REFERENCE TO RELATED APPLICATION

This application is a Continuation-In-Part application of U.S. patent application Ser. No. 08/359,208, now abandoned, filed Dec. 19, 1994, entitled "Process Formation of Thin Film Transistor", which application is incorporated herein by reference in its entirey.

FIELD OF THE INVENTION

The present invention relates to a process for formation of a thin film transistor which can be usefully applied to a high picture quality active matrix liquid crystal display. Particularly, the present invention relates to a process for formation of an improved polysilicon thin film transistor.

BACKGROUND OF THE INVENTION

Generally the polysilicon thin film transistor is used as a peripheral driving IC or a pixel switch of a panel in a high picture quality active matrix LCD (liquid crystal display).

FIG. 1 is a sectional view of the general coplanar polysilicon thin film transistor which is manufactured by the conventional technique.

This thin film transistor will be briefly described referring to FIG. 1.

First, a $SiH_4$ or $Si_2H_4$ gas is used to deposit a non-crystalline silicon layer a-Si upon a transparent substrate 11 (composed of glass or quartz) by applying a plasma enhanced chemical vapor deposition method (PECVD) or by applying a low pressure chemical vapor deposition method (LPCVD). Then a solid phase or liquid phase crystallization is carried out so as to form a polysilicon layer.

Then a photo lithography process is applied to patternize the polysilicon layer so as to define a channel region 12 and a source/drain region.

Then the general self-aligning technique is applied to form a gate oxide layer 13, a gate electrode 14, a source/drain 15, and a protecting oxide layer 16, and metal electrodes 17, thereby forming a polysilicon thin film transistor.

In the above described coplanar thin film transistor, a leakage current during an off State becomes a problem.

In an attempt to overcome the problem of the leakage current, the following techniques have been proposed.

FIG. 2 illustrates an offset type polysilicon thin film transistor in which an electrode 24 and a source/drain region 25 are not vertically overlapped.

This technique is disclosed in Japanese Patent Sho-60-251667.

This method is similar to that of FIG. 1, but a process for forming an offset region is added.

In the above described offset type thin film transistor, of the source/drain region, only the drain region can be formed in the offset type.

FIG. 3 illustrates a polysilicon thin film transistor in which an LDD (light doped drain) region 35– is provided on a side of a heavily doped source/drain region 35.

This technique was proposed in "Lightly Doped Drain TFT Structure for Poly-Si LCDs" by Nakazawa et al., (SID 90 Digest).

This technique is also similar to that of FIG. 1, except that the LDD region 35– forming process is added.

FIG. 4 is a sectional view of a polysilicon thin film transistor in which multi-gate electrodes 44 are provided. This technique was described in "Development and Electrical Properties of Undoped Poly-Si TFTs" by Proano et al. (Proc. of SID Vol. 30/2).

The respective gates are electrically connected.

In this method, if only the gate electrode forming mask is substituted, then it can be manufactured in the same manner as that of FIG. 1.

In the above described various polysilicon thin film transistors, the electrical characteristics are determined by the state of boundaries between the gate oxide layers 13, 23, 33 and 43 and the polysilicon layers 12, 22, 32 and 42 which are channel regions.

Further, disadvantageous phenomena occur basically during the formation of the polysilicon layer.

As described above, in the thin film transistor, the polysilicon layer is formed through crystallization of a non-crystalline silicon.

The non-crystalline silicon is manufactured by being deposited at a temperature of below 580° C. by using a LPCVD or a PECVD method. Alternatively, the non-crystalline silicon is manufactured in such a manner that polysilicon, which is manufactured by being deposited at a temperature of over 600° C., is turned into a non-crystalline form by using an Si self ion implantation method.

The crystallization process includes: a solid phase crystallization based on a furnace annealing or a rapid thermal annealing; and a liquid phase crystallization based on a laser annealing.

That is, in the conventional formation process, the polysilicon layer which is an active layer is mostly formed in the following manner. That is, there is applied a solid phase crystallization method in which a non-crystalline silicon is heat-treated for more than 20 hours below the normal pressure under an inert gas atmosphere.

The polysilicon which is manufactured in this way has large grains, but it has the disadvantages such that defects are frequent within the grains, and that the crystallizing heat treatment is too lengthy.

The lengthiness of the crystallization time causes the result that the nucleation time and the grain growth time become variable. Consequently, the grain sizes of the finally obtained polysilicon are very non-uniform.

Therefore, the characteristics of the boundaries between the polysilicon layer and the gate oxide layer are not optimum.

Consequently, in the case where a thin film transistor is manufactured by using the polysilicon based on the above described methods, the productivity becomes low, the electrical characteristics of the transistor are not optimum, and difficulty is encountered in providing a high density of thin film transistors.

SUMMARY OF THE INVENTION

The present invention is intended to overcome the above described disadvantages of the conventional techniques.

Therefore it is the object of the present invention to provide a process for formation of a polysilicon thin film transistor, in which the solid phase crystallization time for a non-crystalline silicon is shortened so as to improve the productivity, and the grain size of the polysilicon is made more uniform so as to improve the electrical characteristics of the TFT (thin film transistor).

In achieving the above object, a first embodiment of the method of the present invention includes the steps of:

a) depositing an intrinsic non-crystalline silicon layer upon a transparent insulating substrate;

b) heat-treating the non-crystalline silicon layer at a high pressure under an oxygen ($O_2$) atmosphere within an electric furnace, so as to carry out a solid phase crystallization and an oxidation at the same time to form a good polysilicon layer and an oxide layer;

c) patterning the polysilicon layer and the oxide layer to define a gate oxide layer and an active region of the transistor;

d) forming side wall oxide layers on the side walls of the gate oxide layer and on the side walls of the polysilicon layer of the above defined active region;

e) forming a gate electrode at a proper position relative to the gate oxide layer, and carrying out an ion implantation by using the gate electrode as the mask to form a source/drain region on the active region; and f) carrying out a metallization for forming metal electrodes; and wherein g) the pressure of the oxygen atmosphere during the heat treating of the silicon layer to carry out the solid phase crystallization is controlled to be from 1 to 100 atmospheres at a temperature not higher than 600° C.

In another aspect of the present invention, a second embodiment of the process for formation of a polysilicon thin film transistor according to the present invention includes the steps of:

a) depositing an intrinsic non-crystalline silicon layer upon a transparent insulating substrate;

b) heat-treating the non-crystalline silicon layer at a high pressure under an oxygen ($O_2$) atmosphere within an electric furnace, so as to carry out a solid phase crystallization and an oxidation at the same time to form a good polysilicon layer and an oxide layer;

c) patterning the polysilicon layer and the oxide layer to define an active region of the transistor, and then, removing the oxide layer;

d) depositing a gate oxide layer on the whole surface of the substrate on which the active region is defined;

e) forming a gate electrode at a proper position relative to the gate oxide layer, and carrying out an ion implantation by using the gate electrode as the mask to form a source/drain region on the active region;

f) carrying out a metallization for forming metal electrodes; and wherein g) the pressure of the oxygen atmosphere during the heat treating of the silicon layer to carry out the solid phase crystallization is controlled to be from 1 to 100 atmospheres at a temperature not higher than 600° C.

According to the present invention, the formation process time is shortened, so that the productivity is improved. Further, the grain size is more uniform, so that a better polysilicon is obtained.

Particularly, according to the first embodiment of the present invention, the gate insulating layer is grown through as a thermal oxidation of the non-crystalline silicon, and therefore, the insulating property and the boundary characteristics of the polysilicon are improved.

According to the second embodiment of the present invention, the thickness restriction of the gate insulating layer is eliminated, so that the gate insulating layer can be used for a high voltage.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENTS

Figure 1:
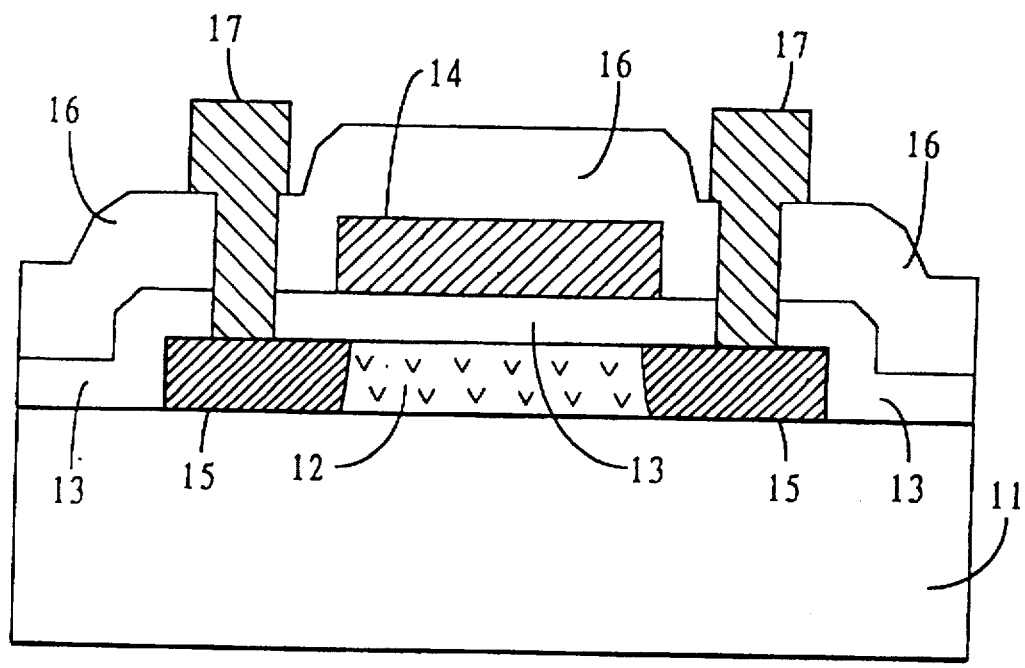
FIG. 1 is a sectional view of a prior art coplanar polysilicon thin film transistor.

FIGS. 5a–5f illustrate the process for formation of a first embodiment of a poly-Si TFT according to the present invention, and FIGS. 6a–6f illustrate the process for formation of a second embodiment of the poly-Si TFT according to the present invention.

For the facilitation of the description, the same elements in the different embodiments of the present are provided with identical reference numerals. Further, descriptions on the common portions are omitted.

Now the first embodiment of the present invention will be described referring to FIGS. 5a to 5f.

Figure 5A:
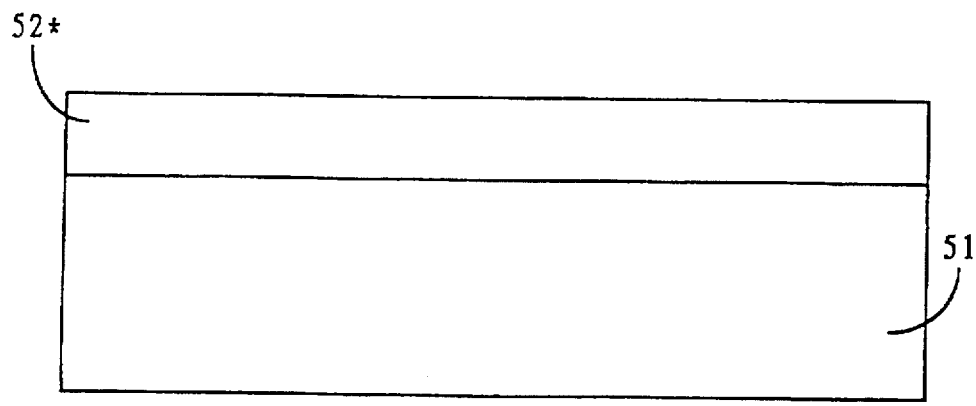
FIGS. 5a to 5f are sectional views showing the process for formation of the first embodiment of the polysilicon thin film transistor according to the present invention.

Referring to FIG. 5a, a first step is to deposit an intrinsic non-crystalline silicon layer 52, upon a transparent insulating substrate 51.

The transparent insulating substrate 51 is composed of glass or quartz.

The non-crystalline silicon layer 52* is formed in a thickness of 200–1,500 Å by using $SiH_4$ or $Si_2H_6$ gas and by application with an LPCVD method, or a PECVD method.

A second step is to heat-treat the non-crystalline silicon layer 52, at 1 or above to 100 $O_2$ atmospheres within an electric furnace so as to form a polysilicon layer 52 and an oxide layer 53.

Figure 5B:
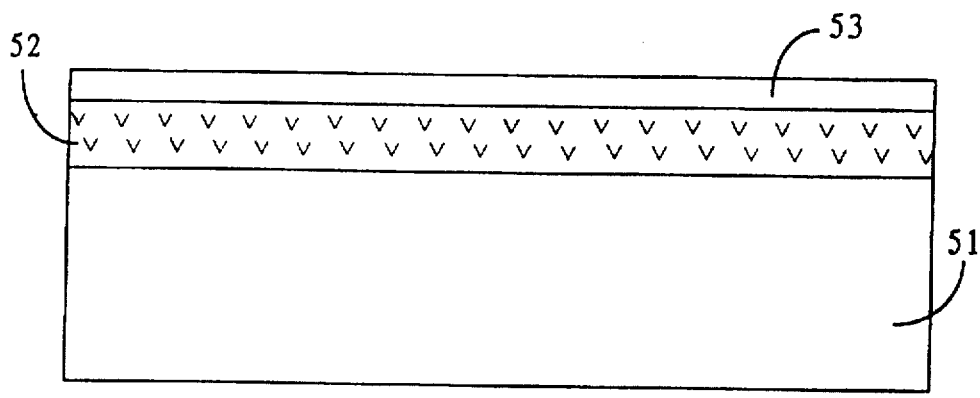

As shown in FIG. 5b, the non-crystalline silicon is subjected to a solid phase crystallization and an oxidation by continuously oxidizing it at a temperature of 600° C. or below at 1 or above to 100 $O_2$ atmospheres within an electric furnace, thereby forming a polysilicon layer 52 and a gate oxide layer 53.

The gate oxide layer 53 which is formed in the above described manner is superior in its insulating properties, and its thickness can be controlled to a thin dimension. However, its use is prohibited for a high voltage for which a thickness of over 500 Å is required.

Figure 5C:
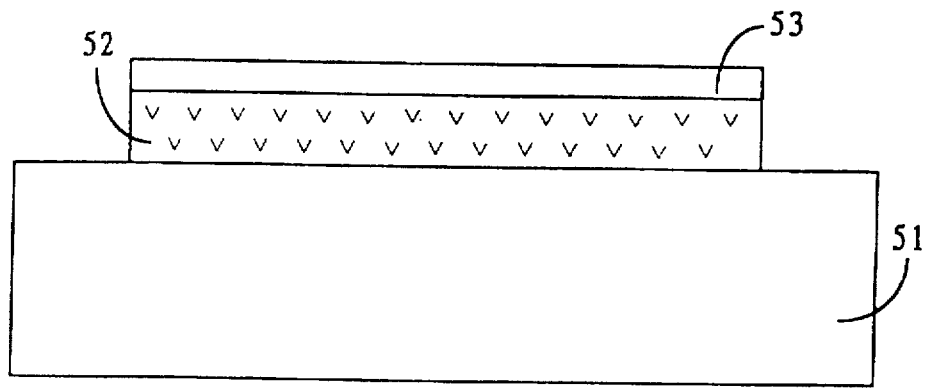

As shown in FIG. 5c, a third step is to pattern the polysilicon layer 52 and the oxide layer 53 by applying a photo lithography process, and thus, an active region of the TFT is defined.

Figure 5D:
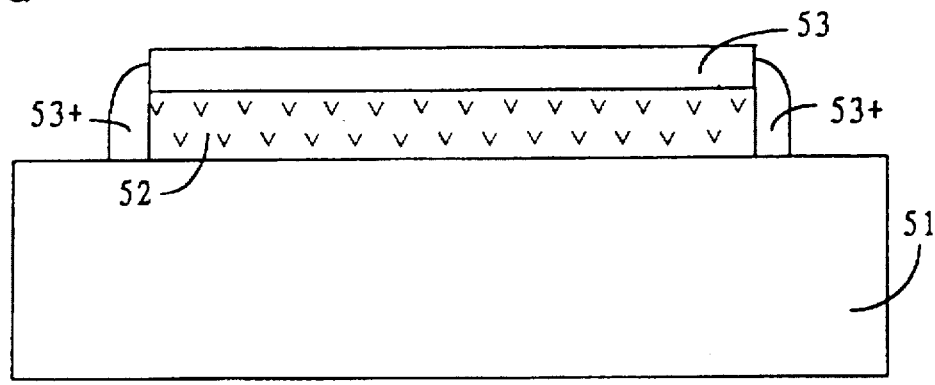

As shown in FIG. 5d, a fourth step is to form side wall oxide layers 53+ on the side walls of the gate oxide layer 53 and on the sidewalls of the polysilicon layer 52 which have been patterned in the above described manner.

The sidewall oxide layer 53+ is formed by applying a high pressure oxidation method at a temperature of 600° C.

A fifth step is to form a gate region and a source/drain region.

Figure 5E:
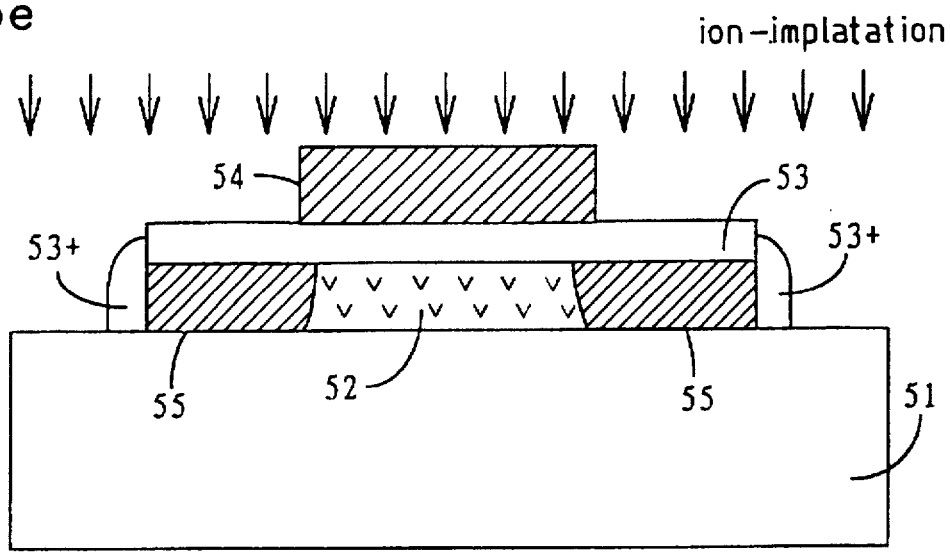

As shown in FIG. 5e, first a polysilicon layer is deposited in a thickness of 1,000–3,000 Å upon the gate oxide layer 53 and on the side wall oxide layer 53+, and a photo lithography method is applied to form a gate electrode 54.

Then, using the gate electrode 54 as the mask, a dopant impurity is ion-implanted so as to form a source/drain region 55.

As the dopant impurity, As or P ions are ion-implanted with a concentration of over $5 \times 10^{14}$ ions/cm$^2$ for the case of an n-channel TFT, while B or $BF_2$ ions are ion-implanted with a concentration of $5 \times 10^{14}$ ions/cm$^2$ for the case of a p-channel TFT.

The fifth step in which the gate and the source/drain are formed can be carried out in various manners.

Figure 2:
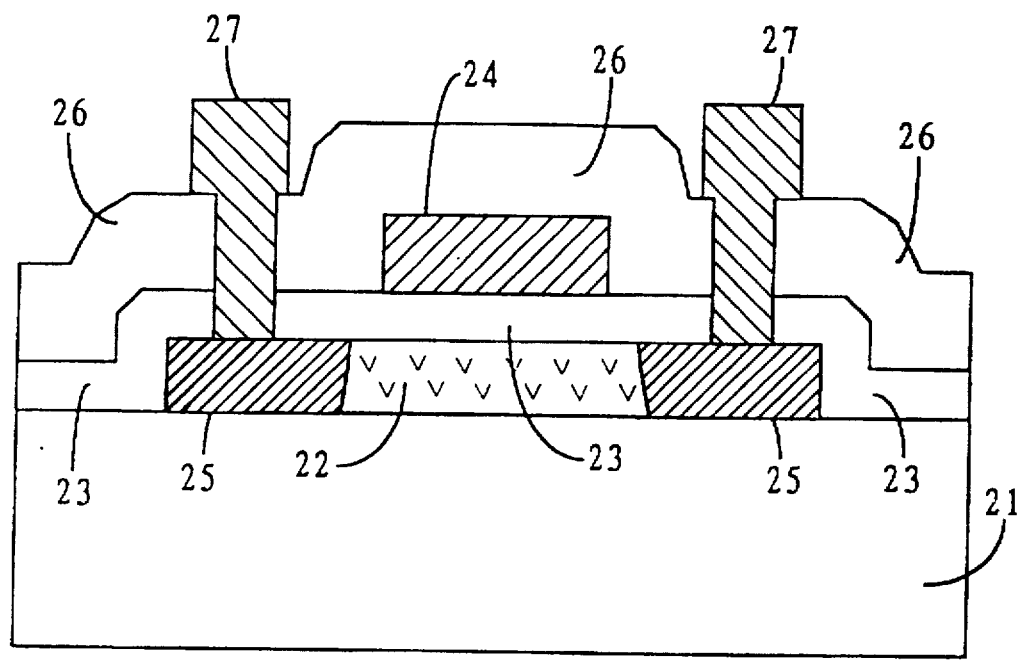
FIG. 2 is a sectional view of a prior art conventional offset type polysilicon thin film transistor.

First, there will be described the case where an offset type TFT (refer to FIG. 2) in which the gate electrode 54 and the source/drain region 55 do not overlap is formed. In this case, the gate electrode 54 is not used as the mask. Instead, a mask which is larger than the width of the pattern of the gate electrode and which is particularly prepared by taking into account the side diffusion region during the ion implantation is used in carrying out the ion implantation.

Figure 3:
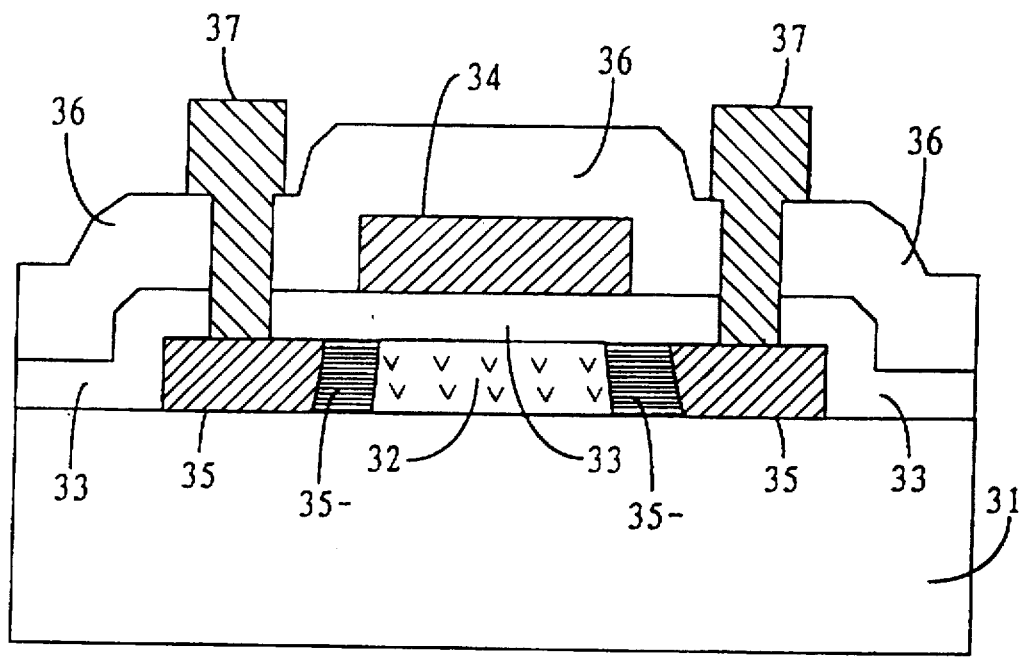
FIG. 3 is a sectional view of a prior art polysilicon thin film transistor having the conventional LDD region.
Figure 4:
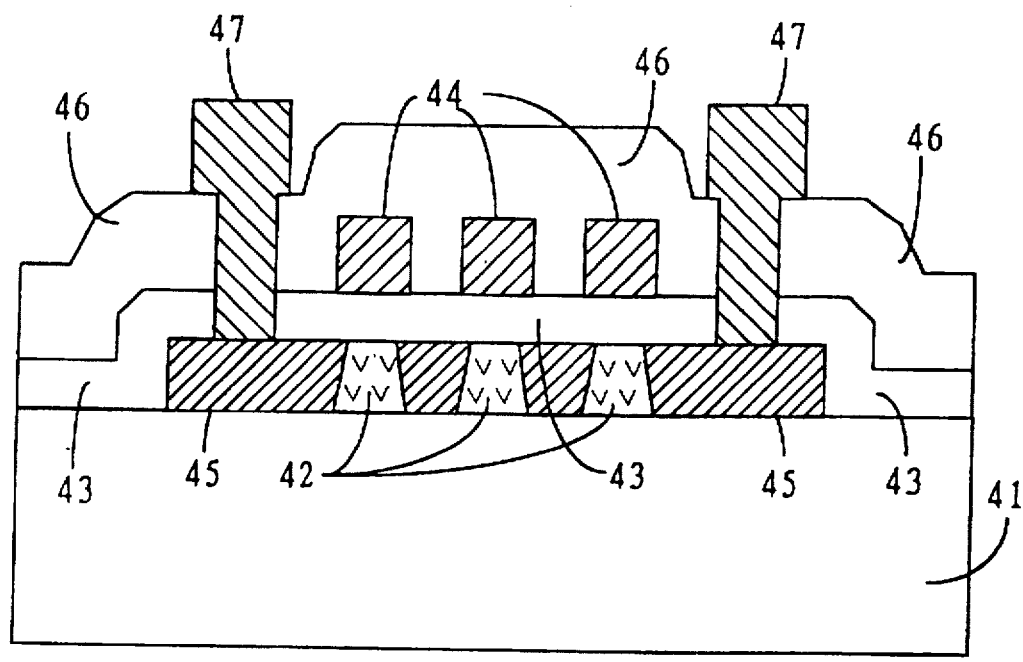
FIG. 4 is a sectional view of a polysilicon thin film transistor having the conventional multiple gates.

In the case of the TFT of the LDD structure of FIG. 3, a mask corresponding to the LDD region is used in carrying out the ion implantation.

If a multi-gate electrode is to be formed, a mask corresponding to the multi-gate pattern is used.

Figure 5F:
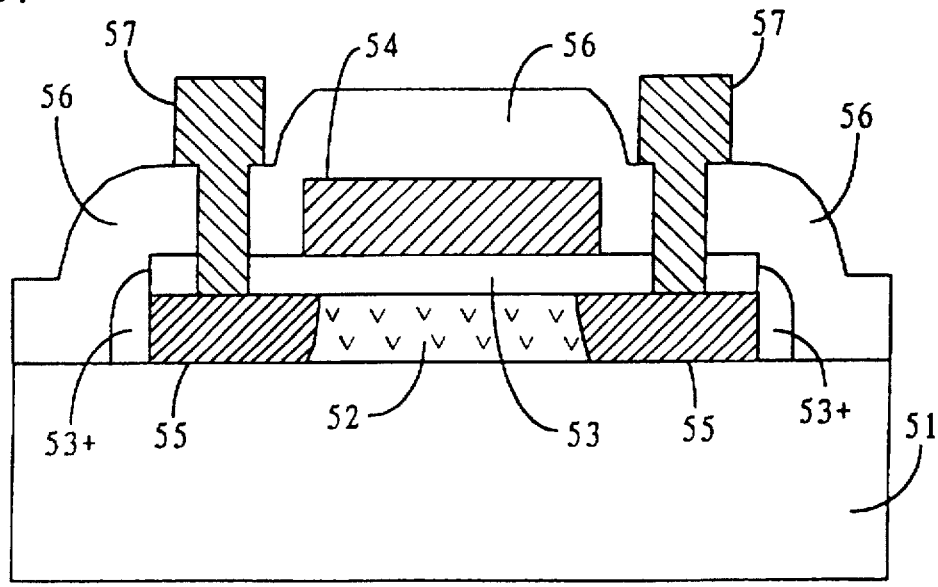

Finally, as shown in FIG. 5f, a metallization step is carried out to form metal electrodes 57 so as to complete the formation of the TFT.

First, a chemical vapor deposition method is applied to deposit a protective layer 56 in a thickness of 3,000–7,000 Å, and then, a photo lithography method is applied to form a contact hole.

Then a metal, such as aluminum, is deposited into the contact hole to form a metal electrode 57, thereby completing the formation of the TFT.

Now the second embodiment of the present invention will be described referring to FIGS. 6a to 6f.

The second embodiment of the present invention is different from the first embodiment in which a thermal oxidation method is applied to form the gate oxide layer, so that the insulating properties are superior, and the thickness can be controlled to a thin level.

In the second embodiment, a deposition method is applied to form a gate oxide layer, so that it can be used for a high voltage TFT.

Further, the step for formation of the side wall oxide layer 53+ (FIG. 5d) is omitted.

First and second steps of the second embodiment (FIGS. 6a and 6b) are same as the first and second steps of the first embodiment.

Figure 6A:
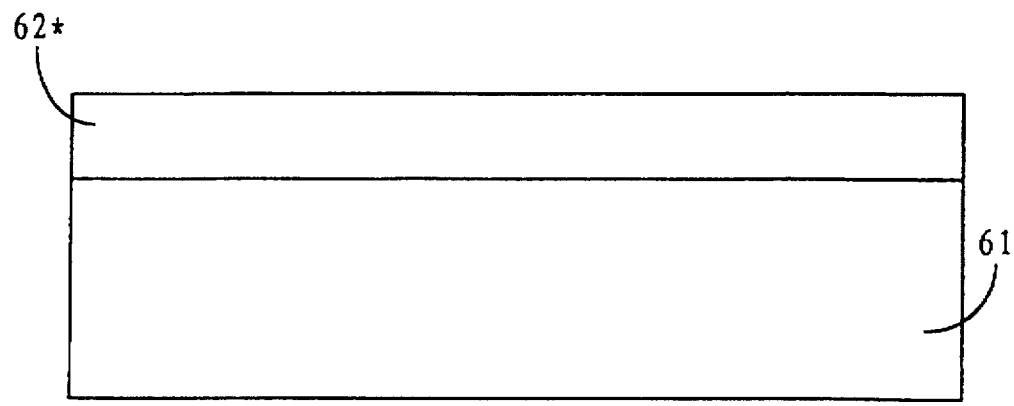
FIGS. 6a to 6f are sectional views showing the process for formation of the second embodiment of the polysilicon thin film transistor according to the present invention.
Figure 6B:
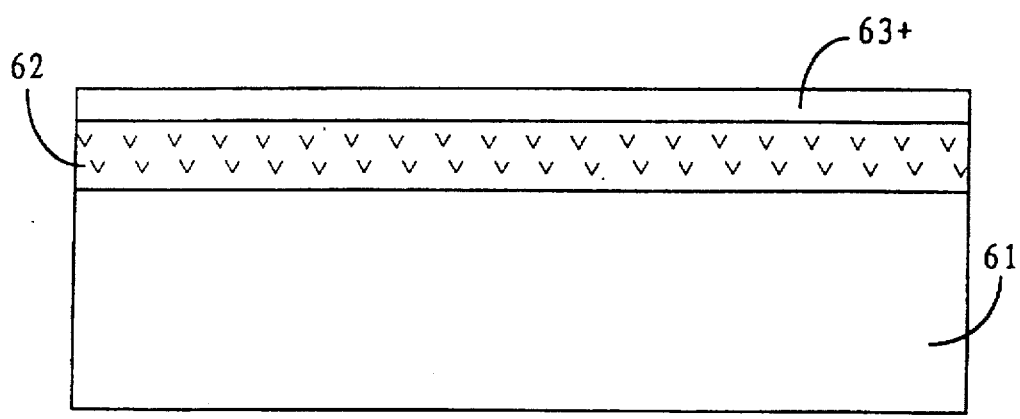
Figure 6C:
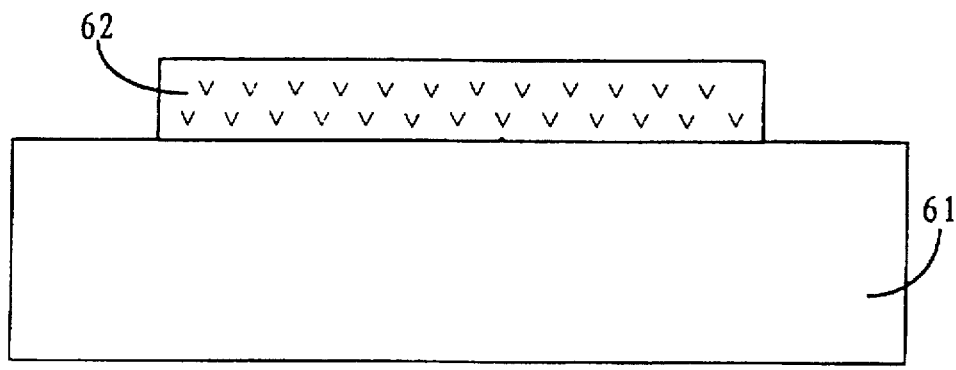

A third step as shown in FIG. 6c is carried out in the following manner. That is, a photo lithography process is applied to pattern a polysilicon layer 62 and an oxide layer 63+. Thus an active region is defined, and then, the thin oxide layer 63+ is removed by applying a wet etching method.

The etchant which is desirable for removing the oxide layer 63+ is fluoric acid.

Figure 6D:
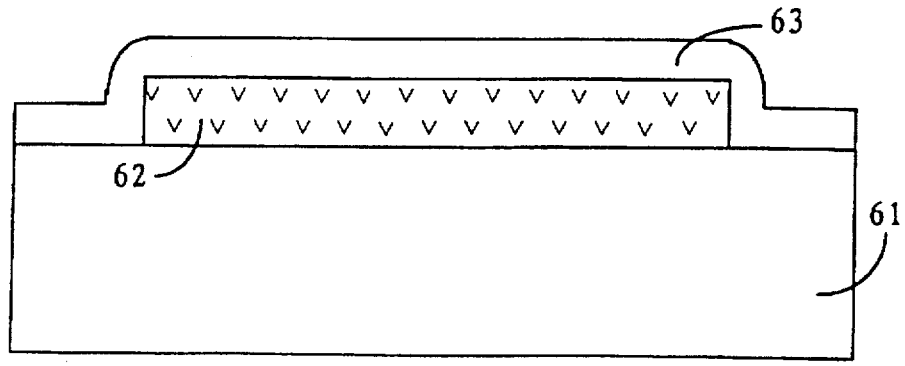
Figure 6E:
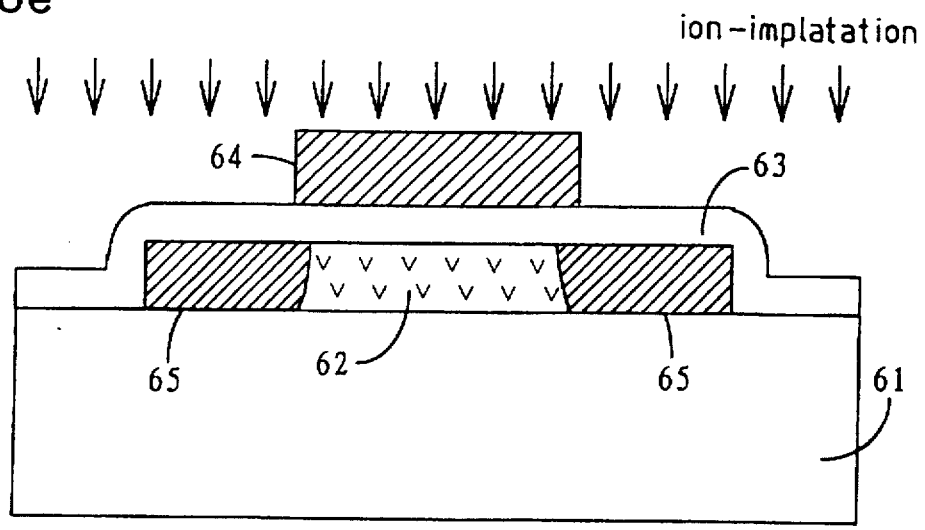
Figure 6F:
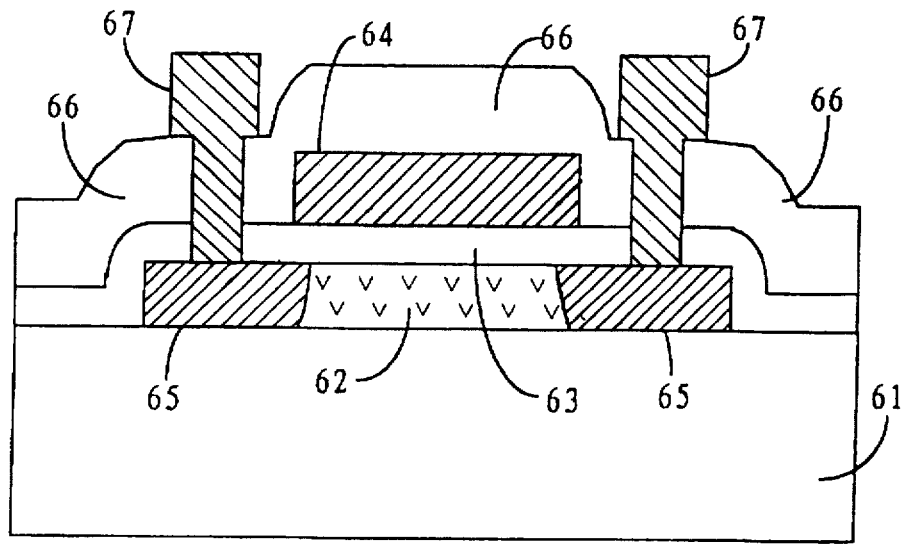

As shown in FIG. 6d, a fourth step is to deposit a gate oxide layer 63 on the whole surface of a substrate 61 in which an active region has been defined.

The thickness of the deposited gate oxide layer 63 should be preferably 100–1,000 Å, but there is no limit because the deposition method is utilized.

The steps of forming a gate electrode 64 and a source/drain region 65 are same as those of the first embodiment, while the metallization step of forming metal electrodes 67 is also same as that of the first embodiment.

Like in the first embodiment, the gate electrode 64 can be formed in a multi-gate structure, and the offset and LDD structures are also possible.

According to the present invention as described above, in order to form the polysilicon film which is the channel region of the thin film transistor, a solid phase crystallization of a non-crystalline silicon is carried out under a high pressure oxygen atmosphere of, for example, 1 or above to 100 $O_2$ atmospheres at lower annealing temperatures of 600° C. or below which permits less expensive amorphous silicon substrates to be used. Thus, the nucleation and the grain forming process are carried out in a shorter period of time, so that the overall solid phase crystallization time and the heat treating time is shortened with an increased productivity. As a result, a channel region can be obtained which is composed of a polysilicon having a uniform grain size distribution.

Figure 7A:
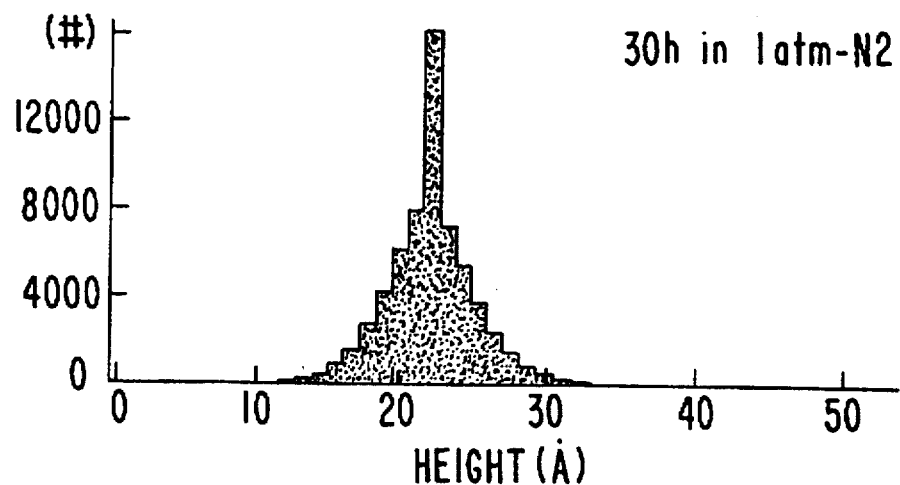
FIG. 7a is a histogram showing the prior art height distribution of the irregularities of the surface of the polysilicon which is formed based on a conventional method.
Figure 7B:
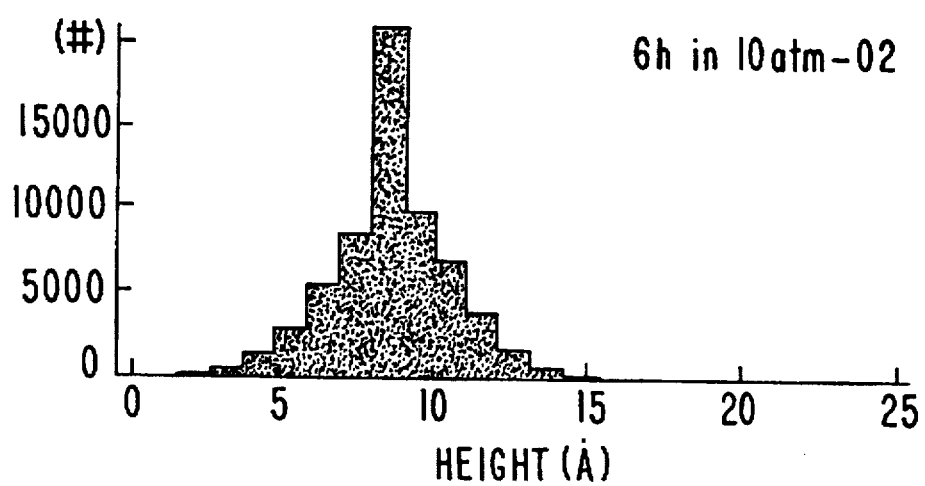
FIG. 7b is a histogram showing the height distribution of the irregularities of the surface of the polysilicon which is formed according to the present invention.

The effects of the present invention are seem by referring to FIGS. 7a and 7b.

FIGS. 7a and 7b are respectively histograms showing the surface irregularities of the polysilicons which are subjected to the solid phase crystallization based on the conventional prior art method and based on the method of the present invention respectively, the surface being observed with an atomic force microscope.

In the case of the heat treatment of the conventional method (30 hours in 1 atm—$N_2$), the surface irregularities are on average as high as 20 Å as shown in FIG. 7a, this being a severe degree.

On the other hand, according to the present invention, the oxide layer is removed by using fluoric acid (HF), and then, when the surface of the polysilicon is observed, the average value of the surface irregularities is as low as 10 Å as shown in FIG. 7b.

Figure 8A:
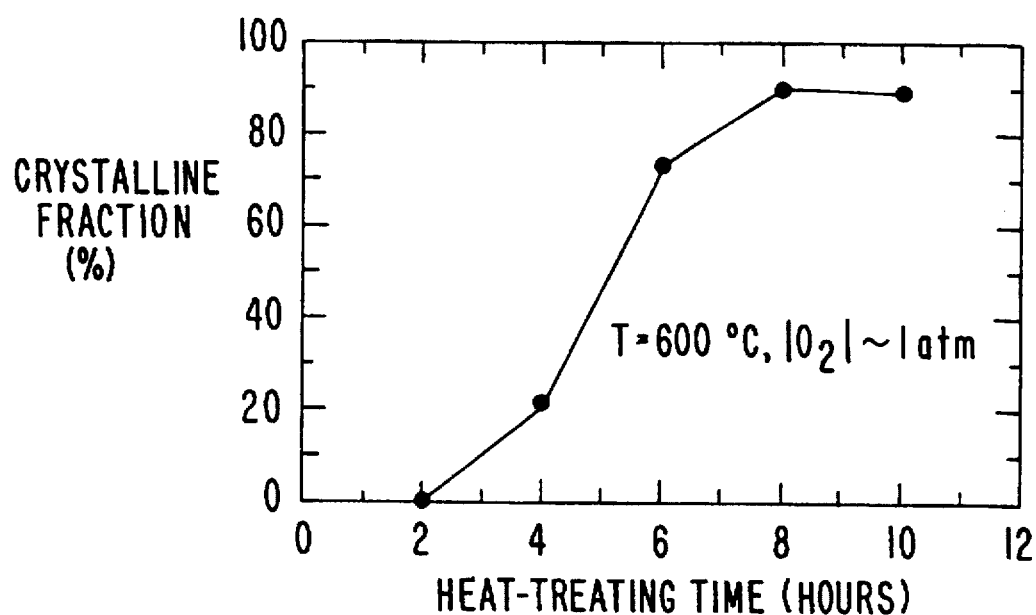
FIG. 8a is a graph of annealing time versus the percentage of conversion of amorphous silicon into a polysilicon thin film at 600° C. with an $O_2$ gas atmosphere.

FIG. 8a illustrates a graph of the crystalline fraction of an amorphous silicon thin film versus annealing time at 600° C. in approximately one atmosphere of $O_2$. The crystalline fraction of the amorphous silicon thin film is determined by a Ramon scattering spectrum and takes at least eight hours. This time makes the manufacturing productivity low.

Figure 8B:
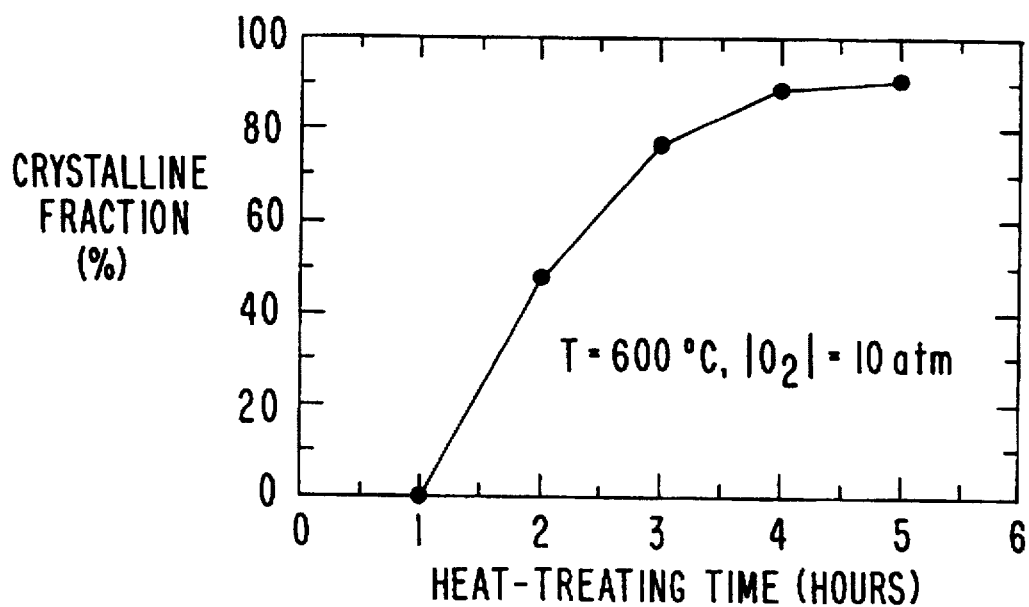
FIG. 8b is a graph of annealing time versus the percentage of conversion of amorphous silicon into polysilicon thin film at 600° C. at 10 atmospheres of $O_2$ in accordance with the present invention.

FIG. 8b illustrates a graph of the crystalline fraction of an amorphous silicon thin film versus annealing time at 600° C. in ten atmospheres of $O_2$. The crystalline fraction of the amorphous silicon thin film is also determined by Ramon scattering and takes four hours. As a result, the manufacturing productivity can be increased and a less expensive silicon substrate of amorphous silicon can be used, which is stable at the lower temperature of 600° C. as compared to the prior art usage of annealing temperatures of 1000° C. The time of annealing in an $O_2$ atmosphere can thus be seen to decrease as the oxygen atmosphere increases from above normal atmospheric pressure to 100 atmospheres.

Therefore, according to the present invention, there can be obtained a polysilicon layer in which the flatness is superior, and a high performance TFT can be manufactured by utilizing the thin film as the active region.

What is claimed is:

1. A process for formation of a polysilicon thin film transistor, comprising the steps of:
   a) depositing an intrinsic non-crystalline silicon layer upon a transparent insulating substrate;
   b) heat-treating said non-crystalline silicon layer at a high pressure under an oxygen ($O_2$) atmosphere within an electric furnace in order to carry out a solid phase crystallization of the non-crystalline silicon layer and an oxidation at the same time to produce a polysilicon layer and an oxide layer;
   c) patterning said polysilicon layer and said oxide layer to define an active region of the transistor, and then, removing said oxide layer;
   d) depositing a gate oxide layer on a whole surface of said substrate on which said active region has been defined;
   e) forming a gate electrode on the gate oxide layer, and carrying out an ion implantation by using the gate electrode as a mask to form a source/drain region on the active region; and
   f) carrying out a metallization for forming metal electrodes; and wherein
   g) the pressure of the oxygen atmosphere during the heat treating of the silicon layer to carry out the solid phase crystallization is controlled to be from 1 to 100 atmospheres at a temperature not higher than 600° C.

2. The process as claimed in claim 1, wherein said source/drain region of step (e) further includes a step of forming an offset structure in said active region by carrying out ion implantation by using a mask larger than a width of a pattern of the gate electrode.

3. The process as claimed in claim 1, wherein step (e) further includes forming a lightly doped drain region in said active region by carrying out an ion implantation by using a separate mask.

4. The process as claimed in claim 1, wherein said gate electrode of step (e) is formed as a multi-gate electrode.

* * * * *